US009806737B2

(12) United States Patent
Craninckx et al.

(10) Patent No.: US 9,806,737 B2
(45) Date of Patent: Oct. 31, 2017

(54) CIRCUIT AND METHOD FOR CONVERTING ANALOG SIGNAL TO DIGITAL VALUE REPRESENTATION

(71) Applicant: IMEC VZW, Leuven (BE)

(72) Inventors: Jan Craninckx, Boutersem (BE); Jonathan Borremans, Lier (BE); Maarten De Bock, Ghent (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/369,777

(22) Filed: Dec. 5, 2016

(65) Prior Publication Data

US 2017/0179976 A1 Jun. 22, 2017

(30) Foreign Application Priority Data

Dec. 16, 2015 (EP) .................................... 15200350

(51) Int. Cl.
*H03M 3/00* (2006.01)
*H03M 1/12* (2006.01)
*H03M 1/36* (2006.01)
*H03M 1/00* (2006.01)

(52) U.S. Cl.
CPC ........... *H03M 3/458* (2013.01); *H03M 3/322* (2013.01); *H03M 3/496* (2013.01); *H03M 1/00* (2013.01); *H03M 1/12* (2013.01); *H03M 1/365* (2013.01); *H03M 3/30* (2013.01)

(58) Field of Classification Search
CPC ............ H03M 3/30; H03M 1/12; H03M 1/00; H03M 1/365

USPC .......................... 341/143, 155, 156, 158, 159
See application file for complete search history.

(56) References Cited

U.S. PATENT DOCUMENTS

| 7,362,255 | B1 * | 4/2008 | Tsyrganovich | ......... H03M 3/34 341/155 |
| 8,502,899 | B2 * | 8/2013 | Wakabayashi | ...... H03M 1/0658 341/155 |

OTHER PUBLICATIONS

Candy, James C., "Using Triangularly Weighted Interpolation to Get 13-Bit PCM from a Sigma-Delta Modulator," IEEE Transactions of Communications (1976) vol. 24, No. 11, p. 1268-1275.

(Continued)

*Primary Examiner* — Joseph Lauture
(74) *Attorney, Agent, or Firm* — Knobbe Martens Olson & Bear LLP

(57) ABSTRACT

A circuit and a method for converting an analog signal to a digital value representation is disclosed. In one aspect, the circuit includes an incremental sigma-delta analog-to-digital converter (ADC). The circuit further includes a first input line for providing a primary analog signal representing a sensor measurement to the incremental sigma-delta ADC. The circuit further includes a second input line for providing a secondary analog signal to the incremental sigma-delta ADC. The incremental sigma-delta ADC receives the primary and secondary analog signals during a first period ($T_{ADC1}$) and a second period ($T_{ADC2}$), respectively. The circuit further includes a filter configured to weight the digital values in a sequence of digital values output by the incremental sigma-delta ADC, and to output a single digital value representing the sensor measurement.

12 Claims, 3 Drawing Sheets

(56) References Cited

OTHER PUBLICATIONS

Chae, Youngcheol, et al., "A 2.1 M Pixels, 120 Frame/s CMOS Image Sensor With Column-Parallel ΔΣ ADC Architecture," IEEE Journal of Solid-State Circuits (2011) vol. 46, No. 1, p. 236-247.
Kim, Jae-Hong, et al., "A 14b Extended Counting ADC Implemented in a 24MPixel APS-C CMOS Image Sensor," Solid-State Circuits Conference Digest of Technical Papers (ISSCC), IEEE International (2012) p. 390-392.
Robert, Jacques, et al., "A Second-Order High-Resolution Incremental A/D Converter with Offset and Charge Injection Compensation," IEEE Journal of Solid-State Circuits (1988) vol. 23, No. 3, p. 736-741.
Soares, Antonio W. A., et al., "Analysis and System-Level Design of a High Resolution Incremental ΣΔ ADC for Biomedical Applications," Integrated Circuits and System Design (2015) p. 1-6.
Temes, Gabor C., et al., "Incremental Data Converters," IEEE Transactions on Circuits and Systems I: Regular Papers (2010) p. 715-721.
Extended European Search Report dated Jul. 1, 2016 for European Application No. 15200350.5.

\* cited by examiner

_US 9,806,737 B2_

CIRCUIT AND METHOD FOR CONVERTING ANALOG SIGNAL TO DIGITAL VALUE REPRESENTATION

RELATED APPLICATIONS

This application claims priority to European Application EP 15200350.5, entitled "CIRCUITRY AND METHOD FOR CONVERTING ANALOG SIGNAL TO DIGITAL VALUE REPRESENTATION," filed on Dec. 16, 2015, and incorporated herein by reference in its entirety.

BACKGROUND

Field

The disclosed technology relates to the field of analog to digital conversion. In particular, the disclosed technology includes a circuit and a method for converting an analog signal to a digital value representation, the circuit comprising an incremental sigma-delta analog-to-digital converter.

Description of the Related Technology

Analog sensor measurements may need to be converted to digital value representations by an analog-to-digital converter (ADC) for processing. An incremental sigma-delta ADC enables high resolution analog-to-digital conversion. The measurement result represented by the analog signal is input as a constant voltage to the incremental sigma-delta ADC. The incremental sigma-delta ADC samples the constant voltage a number of times, M. By increasing the oversampling M, the incremental sigma-delta ADC improves the resolution as the quantization noise is suppressed.

However, in order to achieve a high resolution, the number of samples M needs to be large. Thus, the incremental sigma-delta ADC is associated with a timing constraint, such that the speed of the incremental sigma-delta ADC may be unsatisfactory.

In particular, where measurement results are sequentially acquired, the incremental sigma-delta ADC needs to be able to convert the analog signal to the digital value representation to match a rate at which the measurement results are acquired.

For instance, in imaging devices, pixels may detect light and the detected light forms an analog measurement result that is to be converted to a digital value representation. The analog measurement result is kept stable for a limited time by the pixel. The incremental sigma-delta ADC needs to be sufficiently fast in order to obtain a number of samples during the time that the analog measurement result is stable and convert the analog measurement result to the digital value representation with a satisfactory resolution.

Kim, J.-H. et al, "A 14b Extended Counting ADC Implemented In a 24 Mpixel APS-C CMOS Image Sensor", _International Solid-State Circuits Conference, ISSCC,_ 390-392, February 2012, disclose a two-step conversion of an analog signal in order to reduce conversion time. The two-step conversion uses an incremental sigma-delta ADC which provides a coarse conversion and a cyclic ADC, which is very fast and converts a residue from the incremental sigma-delta ADC to a fine-ADC level. However, this requires a complex circuit using a cyclic ADC in combination with the incremental sigma-delta ADC and will suffer from mismatch between the 2 converting steps.

SUMMARY OF CERTAIN INVENTIVE ASPECTS

One objective of the disclosed technology is to enable fast analog-to-digital conversion with high resolution. Another objective is to allow the fast analog-to-digital conversion to be performed without an increase in circuit complexity.

One aspect is a circuit for converting an analog signal to a digital value representation. The circuit includes an incremental sigma-delta ADC having an input for receiving the analog signal and an output for outputting a sequence of digital values corresponding to samples of the received analog signal. The circuit further includes a first input line for providing a primary analog signal representing a sensor measurement to the input of the incremental sigma-delta ADC. The circuit further includes a second input line for providing a secondary analog signal to the input of the incremental sigma-delta ADC. The input of the incremental sigma-delta ADC receives the primary analog signal from the first input line during a first period of analog-to-digital conversion, and receives the secondary analog signal from the second input line during a second period of analog-to-digital conversion. The circuit further includes a filter configured to receive the sequence of digital values from the incremental sigma-delta ADC, weight the digital values in the sequence of digital values, and output a single digital value representing the sensor measurement.

A second aspect of the disclosed technology is a method for converting an analog signal to a digital value representation. The method includes inputting a primary analog signal representing a sensor measurement to an incremental sigma-delta ADC during a first period of analog-to-digital conversion. The method further includes inputting a secondary analog signal to the incremental sigma-delta ADC during a second period of analog-to-digital conversion following the first period. The method further includes outputting, by the incremental sigma-delta ADC, a sequence of digital values corresponding to samples of the received primary analog signal and secondary analog signal. The method further includes weighting the sequence of digital values to output a single digital value representing the sensor measurement.

In an embodiment, a secondary signal may contribute to analog-to-digital conversion of the incremental sigma-delta ADC. The incremental sigma-delta ADC obtains a first number of samples during the first period of analog-to-digital conversion, a second number of samples during the second period of analog-to-digital conversion, and combines the first and second numbers in the output of a single digital value representing the sensor measurement that is to be converted to digital value representation.

As the resolution of the incremental sigma-delta ADC is dependent on the number of samples obtained by the incremental sigma-delta ADC, the use of samples from a secondary analog signal may improve the resolution of the digital value representation of the primary analog signal.

Even though the secondary analog signal may not represent the sensor measurement, it may be contribute to the conversion of the primary analog signal and improve the resolution of the digital value representation.

In an embodiment, the incremental sigma-delta ADC is of at least a second order. This may be advantageous for use with input of a primary and secondary analog signal during first and second periods of analog-to-digital conversion.

In an incremental sigma-delta ADC of at least a second order, a weight given to the samples is not equal. Rather, early samples are given a higher weight than later samples. In an incremental sigma-delta ADC of second order, the weight of each sample reduces linearly from a first sample to a last sample.

This implies that using a secondary analog signal in an incremental sigma-delta ADC of at least second order provides an improvement to the resolution of the incremental sigma-delta ADC, while also improving the signal-to-noise ratio (SNR) of the digital conversion of the primary analog signal. However, the secondary analog signal may not extend the primary analog signal infinitely while improving the SNR. Rather, there is a limit to how long the second period can be while the SNR is improved.

However, the incremental sigma-delta ADC may alternatively be of a first order. Then, the obtained samples are given equal weight, which implies that the secondary analog signal may add may reduce the SNR of the digital conversion. Although the SNR may be reduced, the incremental sigma-delta ADC may still use the secondary analog signal to improve resolution of the incremental sigma-delta ADC.

In an embodiment, the second period is at least partly overlapping with a third period during which a voltage representing the sensor measurement settles.

A sensor may have a settling period, during which a voltage representing a measurement performed by the sensor settles. During this period, the incremental sigma-delta ADC may not obtain accurate samples. According to the invention, the third period is instead at least partly used for improving the resolution of the digital value representation of a previous measurement. Thus, the sensor need not wait for the incremental sigma-delta ADC to obtain the number of samples necessary for obtaining the desired resolution. Rather, while the sensor output settles to a new value, the incremental sigma-delta ADC may simultaneously process a secondary signal for improving the resolution of the previous measurement.

In an embodiment, the circuit is configured to switch the input of the incremental sigma-delta ADC from the first input line to the second input line in synchronization with a start of the third period. Thus, when a settling period of the sensor measurement starts, the incremental sigma-delta ADC can no longer use the primary analog signal and switches to receive the secondary analog signal.

In an embodiment, the circuit further includes at least one input switch for controlling which of the first input line and the second input line is connected to the input of the incremental sigma-delta ADC. Thus, the circuit may provide a simple structure for allowing switching input to the incremental sigma-delta ADC from the primary analog signal to the secondary analog signal.

In an embodiment, the circuit further includes a controller for controlling the at least one input switch. The controller may thus act, for example, for synchronizing a switch from the first input line to the second input line with a start of the third period.

Similarly, in an embodiment of the method, the method further includes switching input to the incremental sigma-delta ADC from the primary analog signal to the secondary analog signal in synchronization with a start of the third period.

In another embodiment of the method, the primary analog signal is received on a first input line to the incremental sigma-delta ADC and the secondary signal is received on a second input line to the incremental sigma-delta ADC.

In another embodiment of the method, the method further includes switching input to the incremental sigma-delta ADC by controlling which of the first input line and the second input line is connected to the incremental sigma-delta ADC, said switching controlling a transition from the first period to the second period.

In an embodiment, the secondary analog signal may be predictable and reproducible. Thus, the circuit may be set up to handle the secondary analog signal according to an expected input to be received during the second period of analog-to-digital conversion. This implies that the secondary analog signal may be allowed to contribute to the resolution of the primary analog signal without affecting or causing errors in the digital value representation of the sensor measurement.

During manufacture of a device including the circuit, the device may be designed to provide a predetermined and predictable secondary analog signal. Thus, the circuit may be set up accordingly during manufacture to handle the predictable secondary analog signal.

In an embodiment, the secondary analog signal is a constant reference signal. For instance, the secondary analog signal may be a zero voltage signal, which implies that the secondary analog signal provides no bias for affecting an outcome of the digital value representation. However, even if the secondary analog signal has a non-zero voltage, a potential effect of the non-zero voltage on the digital value representation of the sensor measurement may be compensated for as the circuit may be set-up according to an expectation to receive the secondary analog signal having the constant non-zero voltage.

In an embodiment, the secondary analog signal is a periodic signal, wherein an integral over a full period of the periodic signal is predictable, and wherein the second period of analog-to-digital conversion equals an integer number of periods of the periodic signal. The integral over a full period of the periodic signal may be zero, such that secondary analog signal provides no bias for affecting an outcome of the digital value representation. However, even if the integral over a full period is non-zero, the circuit may be set-up to compensate for the non-zero contribution from the secondary analog signal as the integral is predictable.

In an embodiment, the circuit further includes a signal storing component, which is arranged to receive and store the primary analog signal, wherein the signal storing component is connected to the second input line for providing a secondary analog signal which is a copy of the primary analog signal to the input of the incremental sigma-delta ADC. Therefore an analog signal actually representing the sensor measurement may be input to the incremental sigma-delta ADC during both the first and the second period of analog-to-digital conversion. Hence, resolution of the digital value representation of the sensor measurement may be even further improved. However, copying of the primary analog signal may introduce noise, which implies that the SNR may be reduced in comparison to the incremental sigma-delta ADC receiving the primary analog signal during both the first and the second period of analog-to-digital conversion.

According to an embodiment, the circuit may further include an additional ADC, wherein the additional ADC is arranged to receive a residue from the incremental sigma-delta ADC remaining after the first and second periods of analog-to-digital conversion, wherein the additional ADC converts the residue to a digital representation which is combined with the single digital value output by the filter for improving resolution of the analog-to-digital conversion. Thus, the analog-to-digital conversion of an analog signal provided by the first and second periods of analog-to-digital conversion may be further improved by extended counting.

The disclosed technology may find particular use in an imaging device, wherein pixels detect light and the analog signal created is to be converted to digital value representation. In particular, readout of analog signals from the pixels may be performed sequentially through a number of incremental sigma-delta ADCs. Thus, a speed of the incremental sigma-delta ADC may substantially affect a rate at which the imaging device may obtain images.

According to an embodiment, a circuit is provided for converting detected light in a pixel of an imaging device to a digital value representation. The circuit includes an incremental sigma-delta ADC having an input for receiving an analog signal and an output for outputting a sequence of digital values corresponding to samples of the received analog signal. The circuit further includes a first input line for providing a primary analog signal representing detected light of the pixel of the imaging device to the input of the incremental sigma-delta ADC. The circuit further includes a second input line for providing a secondary analog signal to the input of the incremental sigma-delta ADC. The input of the incremental sigma-delta ADC receives the primary analog signal from the first input line during a first period of analog-to-digital conversion and receives the secondary analog signal from the second input line during a second period of analog-to-digital conversion. The circuit further includes a filter configured to receive the sequence of digital values from the incremental sigma-delta ADC, to weight the digital values in the sequence of digital values and to output a single digital value representing detected light in the pixel.

A third aspect of the invention is an imaging device including a plurality of pixels which are each arranged to convert incoming light to a primary analog signal representing detected light in the respective pixels. The plurality of pixels is connected to a plurality of circuits according to the first aspect of the invention for providing the primary analog signals as input to the first input lines. The plurality of circuits are arranged for converting the received primary analog signals to digital values representing detected light in the respective pixels.

Thanks to the use of circuits according to the first aspect of the invention, the imaging device may provide a fast frame rate in relation to the resolution of the digital value representation of the detected light in the pixels.

In an embodiment, the plurality of circuits are arranged for parallel handling of columns of pixels, each circuit being connected to a column line for transferring primary analog signals representing detected light in pixels of the column. The primary analog signals from a row of pixels are simultaneously output to the plurality of circuits from the column lines and the second period of analog-to-digital conversion of the plurality of circuits is at least partly overlapping with a time during which the column lines settle to voltages representing detected light on a next row of pixels.

Thus, readout of an image as acquired by an imaging device can be performed through sequential readouts of pixel values through ADCs. In this embodiment, a single ADC in the imaging device may sequentially convert the pixel values of all pixels in a column to digital value representation. This implies that the readout of the pixel values depends on the speed of the incremental sigma-delta ADC and, since a plurality of conversions are performed by the incremental sigma-delta ADC in a single readout of an image, increasing the speed of the incremental sigma-delta ADC may substantially increase the speed of image readout.

BRIEF DESCRIPTION OF THE DRAWINGS

The above, as well as additional objectives, features and advantages of the disclosed technology, will be better understood through the following illustrative and non-limiting detailed description of embodiments of the disclosed technology, with reference to the appended drawings. In the drawings, the size of some of the elements may be exaggerated and not drawn to scale for illustrative purposes. The dimensions and the relative dimensions do not correspond to actual reductions to practice of the disclosed technology. In the drawings like reference numerals will be used for like elements unless stated otherwise.

DETAILED DESCRIPTION OF CERTAIN EMBODIMENTS

Detailed embodiments of the disclosed technology will now be described with reference to the drawings.

Figure 2:
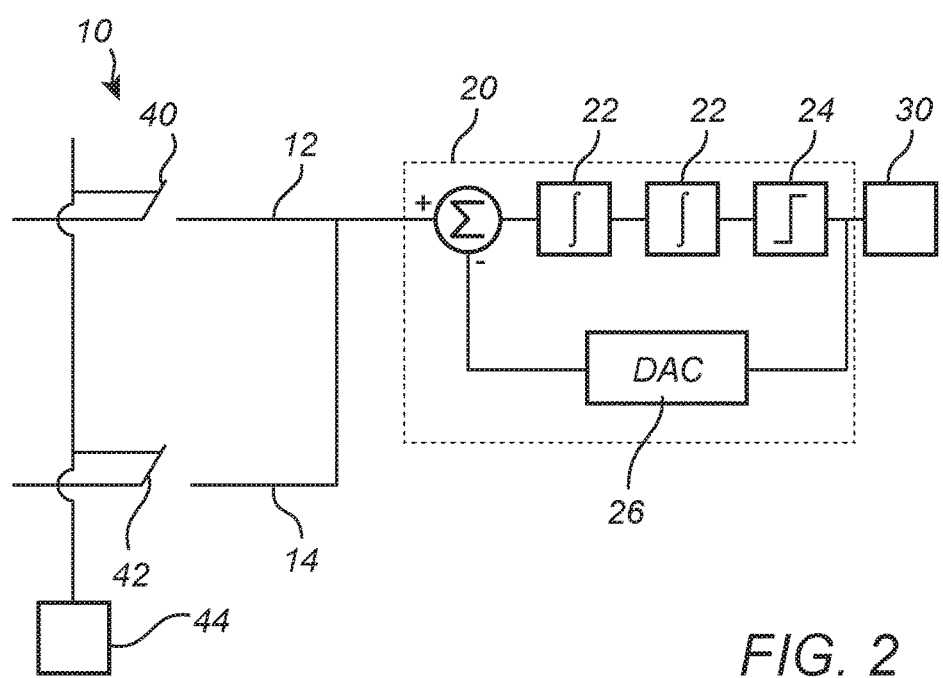
FIG. 2 is a schematic view of a circuit for analog-to-digital conversion according to a first embodiment of the invention.

According to the first aspect, the disclosed technology relates to a circuit 10 for converting analog signals to digital value representations, the circuit 10 comprising an incremental sigma-delta analog-to-digital converter (ADC) 20, as shown in FIG. 2. The incremental sigma-delta ADC 20 is arranged to convert an analog signal representing an analog measurement result to a digital value representation.

Figure 1:
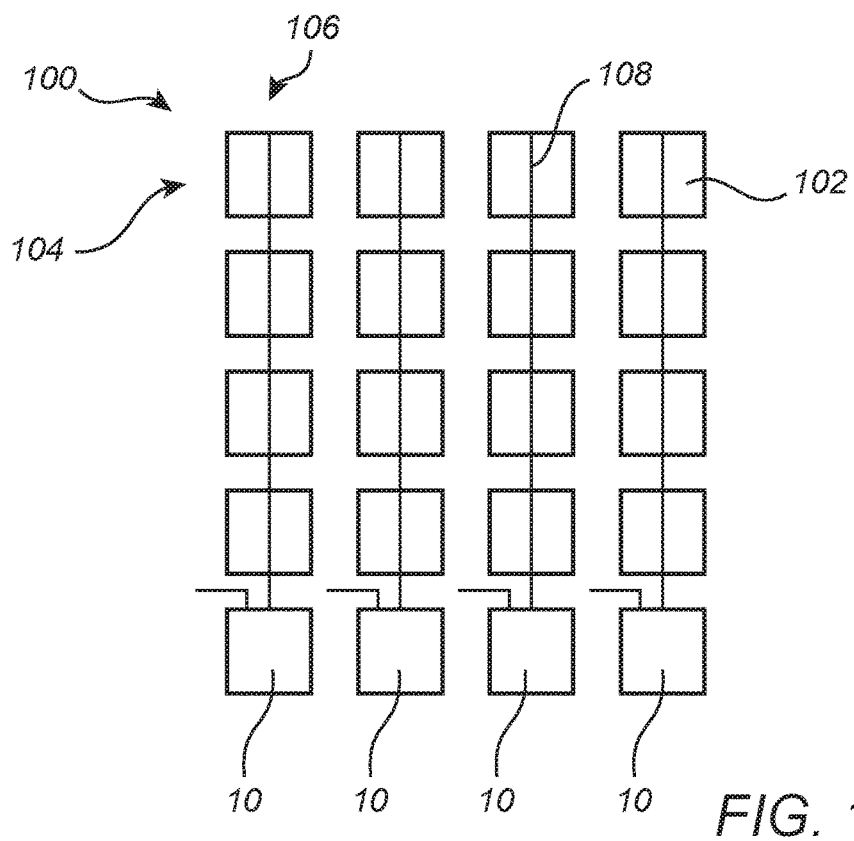
FIG. 1 is a schematic view of an imaging device including analog-to-digital converters.

Referring to FIG. 1, an imaging device 100 will first be described in order to set a context in which the circuit 10 has particular application.

However, it should be realized that the circuit 10 comprising the incremental sigma-delta ADC 20 may also be used in other applications, as will be further explained below although such applications are not described at a same level of detail.

As shown in FIG. 1, the imaging device 100 may include a number of pixels 102, which are each arranged to receive incoming light. The pixels 102 detect an intensity of incoming light by converting the incoming light to a voltage having a voltage level representing the intensity of the incoming light.

The voltages of the pixels 102 are output to respective circuits 10 for performing analog-to-digital conversion. Hence, the imaging device 100 may be arranged to output a digital image.

The pixels 102 may be arranged in rows 104 and columns 106. When an image is acquired by detecting incoming light on the respective pixels 102, the image may be read out from the pixels 102 one row at a time. Hence, a plurality of circuits 10 for converting analog signals to digital value representation may be arranged, such that each circuit 10 receives a signal from a respective column 106 of the pixels 102.

A column line 108 may be connected to an input of the circuit 10. Thus, the voltages in the pixels 102 at a bottom row 104 may be output as analog signals to the respective circuits 10. The analog signals are kept stable on the column line 108 for a period of time allowing the incremental sigma-delta ADCs 20 of the circuits 10 to sample the analog signals a plurality of times. Then, the information held in the pixels 102 is sequentially put on the columns lines 108 and as such transferred to the circuits 10 for reading out the entire image row per row. The voltage on the column line 108 needs to settle before the circuit 10 may start conversion of the analog signal.

Since each circuit 10 may be arranged to convert a plurality of analog signals during readout of an image, the speed of analog-to-digital conversion by the circuit 10 substantially affects the speed of readout of the image.

It should be realized that other arrangements of the circuits 10 for analog-to-digital conversion in relation to pixels 102 may be contemplated. For instance, a single circuit 10 may be used and the information in each pixel 102 may be transferred in sequence to the single circuit 10 for analog-to-digital conversion. According to another alternative, each pixel 102 may be connected to a respective circuit 10 for analog-to-digital conversion.

FIG. 2 is a schematic view of the circuit 10 for analog-to-digital conversion according to a first embodiment of the invention.

The circuit 10 includes a first input line 12. The first input line 12 may be connected to the column line 108 or another line for providing an analog signal to the incremental sigma-delta ADC 20. The signal on the first input line 12 may provide a primary analog signal as input to the incremental sigma-delta ADC 20.

The circuit 10 further includes a second input line 14. The second input line 14 may be connected to a source (not shown) for providing a secondary analog signal as input to the incremental sigma-delta ADC 20.

The incremental sigma-delta ADC 20 is arranged to sample input a plurality of times M. By increasing the oversampling M, the incremental sigma-delta ADC improves the resolution as the quantization noise is suppressed.

The incremental sigma-delta ADC 20 may include a plurality of cascaded integrators 22, a quantizer 24 and a feedback loop from the quantizer 24 comprising a digital-to-analog converter 26. A number of integrators 22 set an order of the incremental sigma-delta ADC 20. Thus, if the incremental sigma-delta ADC 20 includes a single integrator 22, it is a first order incremental sigma-delta ADC 20. If the incremental sigma-delta ADC 20 includes two integrators 22, it is a second order incremental sigma-delta ADC 20.

The incremental sigma-delta ADC 20 provides an output as a sequence of digital values from the quantizer 24. The output is provided to a digital decimation filter 30. The output from the quantizer 24 is also fed back via the DAC 26 to be subtracted from the input to the first integrator 22.

At start of a conversion, the integrator states and the decimation filter states are reset to zero. The number of quantization levels provided by the incremental sigma-delta ADC 20 depends on the number of samples M and the order of incremental sigma-delta ADC 20. For a first order incremental sigma-delta ADC 20, M quantization levels are provided. For a second order incremental sigma-delta ADC 20, $M^2/2$ quantization levels are provided.

The digital decimation filter 30 provides a weighting of the sequence of digital values that is dependent on the order of the incremental sigma-delta ADC 20. For a first-order incremental sigma-delta ADC 20, the digital decimation filter 30 provides an equal weight to each sample. For a second-order incremental sigma-delta ADC 20, the digital decimation filter 30 provides a weight as indicated in FIG. 3A.

Figure 3A:
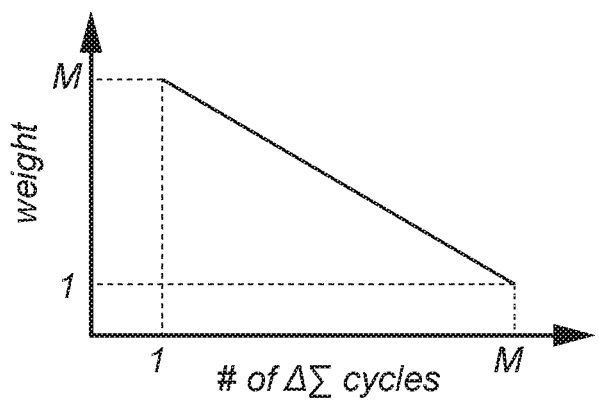
FIG. 3A is a chart illustrating filter weights for samples of analog signals to be converted to digital value representation.

As shown in FIG. 3A, a larger weight is given to early digital values in the sequence and the weight is decreasing towards an end of the sequence. The area under the curve in FIG. 3A is $M^2/2$, which also explains the number of quantization levels of the incremental sigma-delta ADC 20.

As discussed above, the circuit 10 includes a first input line 12 and a second input line 14. The analog-to-digital conversion of the primary analog signal on the input line 12 may therefore be improved by use of the secondary analog signal.

The input to the incremental sigma-delta ADC 20 is provided during a first period of analog-to-digital conversion by the primary analog signal on the first input line 12. If the incremental sigma-delta ADC 20 is of at least a second order, the weight of samples obtained from the primary analog signal is relatively high.

The input to the incremental sigma-delta ADC 20 may further be provided during a second period of analog-to-digital conversion by the secondary analog signal on the second input line 14. A resolution of digital conversion of the sensor measurement provided on the first input line 12 may be improved by using the secondary analog signal as well.

The incremental sigma-delta ADC 20 may thus obtain samples during both the first and the second period. Thus, a large number of samples may be obtained and the resolution of the conversion may thus be high.

Figure 3B:
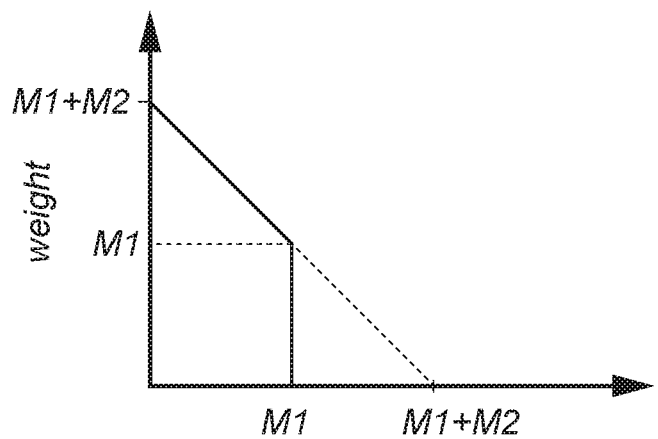
FIG. 3B is a chart illustrating filter weights for samples of analog signals to be converted to digital value representation.

FIG. 3B shows a weighting applied by the digital decimation filter 30 for sampling during the first and second period. As shown in FIG. 3B, a number of quantization levels of the sensor measurement provided by the circuit 10 becomes $M_1^2+(M_1 \times M_2)/2$, where $M_1$ is the number of samples during the first period and $M_2$ is the number of samples during the second period.

Hence, if the first and second period are equally long, the number of quantization levels in comparison to merely using the primary analog signal as input, is 3 times as high. Thus, resolution of the analog-to-digital conversion is substantially increased by using the secondary analog signal during a second period of analog-to-digital conversion.

However, the secondary analog signal introduces noise to the analog-to-digital conversion. Thus, the SNR of the digital value representation of the sensor measurement may not be as good as if the sensor measurement would have been provided as input to the incremental sigma-delta ADC 20 during both the first and the second period.

Still the SNR of the conversion of the primary signal might be increased depending on the length of the second period. For instance, when using a second order incremental sigma-delta ADC, it may be shown that if the first and second periods are equally long, the thermal noise is approximately reduced by a factor of 8 or 9. If an application demands a low thermal noise, the thermal noise may be lowered by design of the incremental sigma-delta ADC 20 so that the noise of a single sample is lowered. This may be achieved by, for example, increasing a sampling capacitor as is known to a person skilled in the art.

The secondary analog signal may be provided by a circuit that provides a reproducible and predictable signal. The incremental sigma-delta ADC 20 may thus be set up to account for a voltage provided by the secondary analog signal, such that the input of the secondary analog signal does not affect the result of the digital value representation output by the circuit 10.

For instance, the secondary analog signal may be a simple zero voltage signal or a constant reference signal having a constant voltage. The incremental sigma-delta ADC 20 may be pre-configured to handle a constant voltage input in the secondary voltage signal so that the voltage does not affect the result of the output digital value representation.

In another embodiment, the secondary analog signal may be a periodic signal. The periodic signal may have a period that matches a length of the second period during which the secondary analog signal is input to the incremental sigma-delta ADC 20 such that an integer number of periods of the periodic signal will be input. Further, an integral over a full period of the periodic signal may be predictable such that the incremental sigma-delta ADC 20 may be pre-configured to handle the integrated voltage input in the secondary voltage signal so that the voltage does not affect the result of the output digital value representation.

In fact, as long as the secondary analog signal is predictable, the secondary analog signal could have an arbitrary shape. The incremental sigma-delta ADC can then be set up to handle the predictable contribution from the secondary analog signal so that it does not affect the result of the digital value representation output by the circuit 10.

The circuit 10 may further include at least one input switch for controlling which of the first input line 12 and the second input line 14 is connected to the input of the incremental sigma-delta ADC 20. As shown in FIG. 2, a first input switch 40 may be provided in the first input line 12 and a second input switch 42 may be provided in the second input line 14.

The circuit 10 may further include a controller 44 which may be connected to the first and second input switches 40, 42 for activating the switches 40, 42 to be opened or closed.

As indicated above, the secondary analog signal may be used for improving resolution of the digital value representation of the sensor measurement represented by the primary analog signal. In the imaging device 100, the second period may be arranged to overlap with a period during which the voltage on the column line 108 settles. When the voltage on the column line 108 settles, the incremental sigma-delta ADC 20 may not use the input from the column line 108. Instead, the incremental sigma-delta ADC 20 may use this period to lengthen a time of analog-to-digital conversion for improving the resolution of previous pixel voltages.

This implies that time management of functions in the imaging device 100 may be improved as the incremental sigma-delta ADC 20 may operate at least partly simultaneously with a period during which a voltage on the column line 108 settles.

A parallel operation of the incremental sigma-delta ADC 20 with column line 108 settling may be used in different ways. If it is desired that the resolution of an ordinary imaging device 100 is to be improved, the secondary analog signal input to the incremental sigma-delta ADC 20 may be used for improving resolution while not affecting speed of the imaging device. However, if it is desired that speed of the imaging device 100 is to be improved, the period during which the column line signal is provided to the incremental sigma-delta ADC 20 may be shortened, and the settling time may be used for input of a secondary analog signal such that the resolution is not affected by the improved speed of the imaging device 100.

Figure 4:
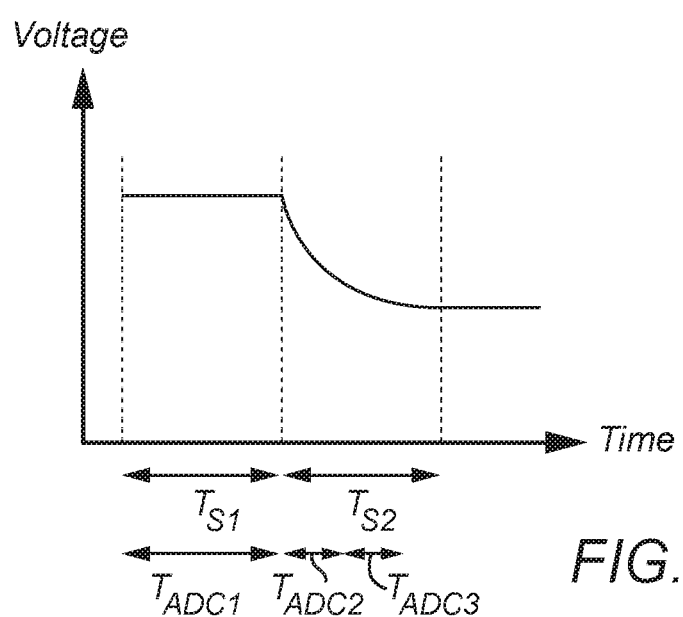
FIG. 4 is a chart illustrating timing of a first and a second period for analog-to-digital conversion.

FIG. 4 is a chart illustrating timing of a first and a second period for analog-to-digital conversion. For instance, a voltage on the column line 108 of an imaging device representing incoming light on a pixel 102 may be kept stable on the column line 108 for a period of time, $T_{S1}$. During this period, the first switch 40 is closed such that the primary analog signal is provided as input to the incremental sigma-delta ADC 20 and a number of samples, $M_1$, are taken. The period during which the first switch 40 is closed represent a first period $T_{ADC1}$ of analog-to-digital conversion, as indicated in FIG. 4.

Then, information held in the pixel 102 of another row 104 is put on the column line 108 for transfer to the circuit 10. The column line 108 then needs a period of time, $T_{S2}$, to settle to the new voltage.

At the same time as the signal put on the column line 108 is changed, the controller 44 may activate the switches 40, 42 such that the first switch 40 is opened and the second switch 42 is closed. Thus, the secondary analog signal is provided as input to the incremental sigma-delta ADC 20, and a number of samples, $M_2$, are taken. The period during which the second switch is closed represents a second period $T_{ADC2}$ of analog-to-digital conversion, which may be equally long as the settling period $T_{S2}$ or shorter.

The incremental sigma-delta ADC 20 may also be combined with extended counting for providing a fine-ADC level. Hence, after the first and second periods of input of the primary analog signal and the secondary analog signal to the incremental sigma-delta ADC 20, a residue of the analog-to-digital conversion may be provided to another ADC for conversion. For instance, the residue may be provided to a cyclic ADC for very fast conversion. This is illustrated in FIG. 4 as a further period $T_{ADC3}$ of analog-to-digital conversion.

Figure 5:
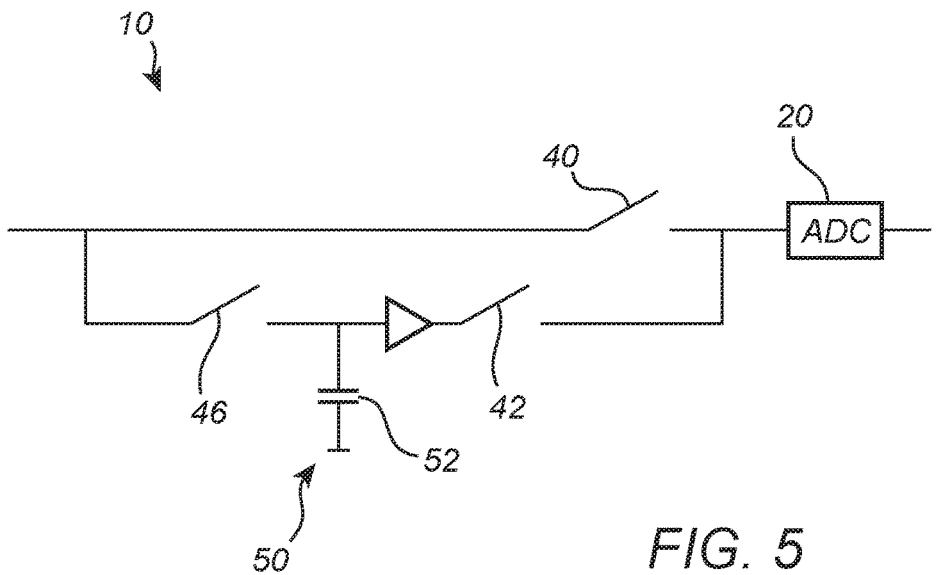
FIG. 5 is a schematic view of a circuit for analog-to-digital conversion according to a second embodiment of the invention.

Referring now to FIG. 5, the secondary analog signal may alternatively be based on the primary analog signal. As shown in FIG. 5, the circuit 10 may include a signal storing component 50. The signal storing component 50 may include a capacitor 52 which receives the primary analog signal and stores the voltage of the primary analog signal.

The circuit 10 may be provided with an additional switch 46 for controlling that the primary analog signal is connected to the signal storing component during the first period such that the primary analog signal may be received and stored in the capacitor 52.

When the secondary analog signal is to be input to the incremental sigma-delta ADC 20, the switch 42 is closed for providing the voltage in the capacitor 52 to the incremental sigma-delta ADC 20.

The copy of the primary analog signal may improve resolution of the digital value representation of a sensor measurement. However, the copy of the primary analog signal may not be an exact copy and extra noise is introduced when the primary analog signal is copied.

Figure 6:
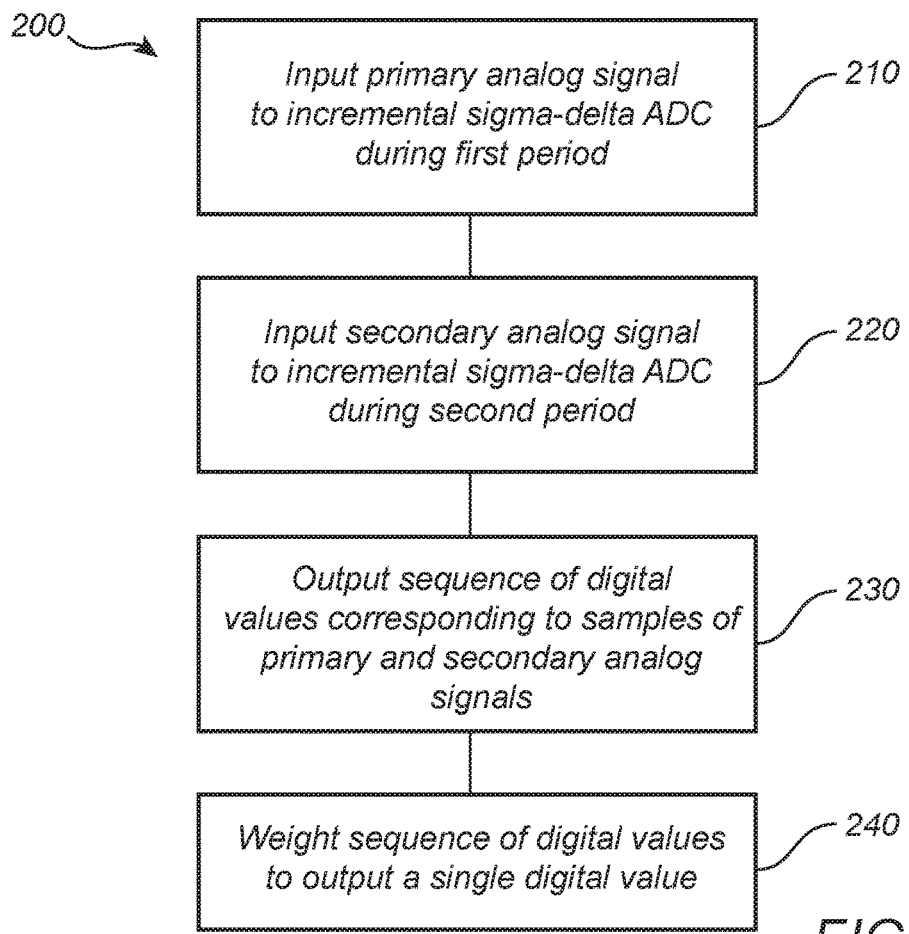
FIG. 6 is a flowchart of a method for converting an analog signal to a digital value representation according to an embodiment of the invention.

FIG. 6 is a flowchart of a method 200 for converting an analog signal to a digital value representation.

In block 210, the method 200 inputs a primary analog signal to an incremental sigma-delta ADC 20 during a first period of analog-to-digital conversion. In an embodiment, the analog signal represents a sensor measurement.

In block 220, the method 200 inputs a secondary analog signal to the incremental sigma-delta ADC 20 during a second period of analog-to-digital conversion following the first period.

In block 230, during analog-to-digital conversion, the method 200 outputs, by the incremental sigma-delta ADC 20 outputs, a sequence of digital values corresponding to samples of the received primary analog signal and secondary analog signal.

In block 240, the method 200 weights the sequence of digital values, by the digital decimation filter 30 to output a single digital value, which represents a voltage of the analog signal input to the incremental sigma-delta ADC 20. In an embodiment, the output single digital value represents the sensor measurement.

The circuit 10 for converting an analog signal to a digital value representation may be useful in several applications. The circuit 10 may be especially useful in applications where a sequence of sensor measurements are provided and are to be converted to digital value representation. The sequence of sensor measurements may be provided by a single sensor that captures a sequence of sample measurements. However, the sequence of sensor measurements may also be provided by a plurality of sensors that share the same circuit 10.

The circuit 10 may utilize a dead-time in the sequence of sensor measurements during which the analog signal representing the sensor measurement may not be input to the incremental sigma-delta ADC 20. This may be for instance due to a voltage of the analog signal settling. Thus, the dead-time is used for improving resolution of the analog-to-digital conversion by providing a secondary analog signal to the incremental sigma-delta ADC 20 during the dead-time.

According to an example, the circuit 10 may be used in a neuroprobe, wherein a plurality of different sensor measurements is provided from different multiple matrix-arranged electrodes, which are connected to different neurons.

In the above the disclosed technology has mainly been described with reference to a limited number of embodiments. However, as is readily appreciated by a person skilled in the art, other embodiments than the ones disclosed above are equally possible within the scope of the disclosed technology, as defined by the appended claims.

Depending on the embodiment, certain acts, events, or functions of any of the methods described herein can be performed in a different sequence, can be added, merged, or left out altogether (e.g., not all described acts or events are necessary for the practice of the method). Moreover, in certain embodiments, acts or events can be performed concurrently, rather than sequentially.

The previous description of the disclosed examples is provided to enable any person skilled in the art to make or use the present invention. Various modifications to these examples will be readily apparent to those skilled in the art, and the generic principles defined herein may be applied to other examples without departing from the spirit or scope of the invention. As will be recognized, certain embodiments of the inventions described herein can be embodied within a form that does not provide all of the features and benefits set forth herein, as some features can be used or practiced separately from others. The scope of certain inventions disclosed herein is indicated by the appended claims rather than by the foregoing description. All changes which come within the meaning and range of equivalency of the claims are to be embraced within their scope. Thus, the present invention is not intended to be limited to the examples shown herein but is to be accorded the widest scope consistent with the principles and novel features disclosed herein.

What is claimed is:

1. A circuit for converting an analog signal to a digital value representation, comprising:
    an incremental sigma-delta analog-to-digital converter (ADC) having an input for receiving the analog signal and an output for outputting a sequence of digital values corresponding to samples of the received analog signal;
    a first input line for providing a primary analog signal representing a sensor measurement to the input of the incremental sigma-delta ADC;
    a second input line for providing a secondary analog signal to the input of the incremental sigma-delta ADC, wherein the input of the incremental sigma-delta ADC receives the primary analog signal from the first input line during a first period of analog-to-digital conversion and receives the secondary analog signal from the second input line during a second period of analog-to-digital conversion; and
    a filter configured to receive the sequence of digital values from the incremental sigma-delta ADC, to weight the digital values in the sequence of digital values and to output a single digital value representing the sensor measurement, wherein the second period is at least partly overlapping with a third period during which a voltage representing the sensor measurement settles.

2. The circuit of claim 1, wherein the circuit is configured to switch the input of the incremental sigma-delta ADC from the first input line to the second input line in synchronization with a start of the third period.

3. The circuit of claim 1, further comprising at least one input switch for controlling which of the first input line and the second input line is connected to the input of the incremental sigma-delta ADC.

4. The circuit of claim 3, further comprising a controller for controlling the at least one input switch.

5. The circuit of claim 1, wherein the secondary analog signal is a constant reference signal.

6. The circuit of claim 1, wherein the secondary analog signal is a periodic signal, wherein an integral over a full period of the periodic signal is predictable, and wherein the second period of analog-to-digital conversion equals an integer number of periods of the periodic signal.

7. The circuit of claim 1, further comprising a signal storing component arranged to receive and store the primary analog signal, wherein the signal storing component is connected to the second input line for providing a secondary analog signal which is a copy of the primary analog signal to the input of the incremental sigma-delta ADC.

8. An imaging device, comprising:
    a plurality of pixels, which are each arranged to convert incoming light to a primary analog signal representing detected light in the respective pixels, wherein the plurality of pixels are connected to a plurality of circuits according to claim 1 for providing the primary analog signals as input to the first input lines, wherein the plurality of circuits are arranged for converting the received primary analog signals to digital values representing detected light in the respective pixels, wherein the plurality of circuits are arranged for parallel handling of columns of pixels, each circuit being connected to a column line for transferring primary analog signals representing detected light in pixels of the column, wherein primary analog signals from a row of pixels are simultaneously output to the plurality of circuits from the column lines and wherein the second period of analog-to-digital conversion of the plurality of circuits is at least partly overlapping with a time during which the column lines settle to voltages representing detected light on a next row of pixels.

9. A method for converting an analog signal to a digital value representation, comprising:

inputting a primary analog signal representing a sensor measurement to an incremental sigma-delta analog-to-digital converter (ADC) during a first period of analog-to-digital conversion;

inputting a secondary analog signal to the incremental sigma-delta ADC during a second period of analog-to-digital conversion following the first period;

outputting, by the incremental sigma-delta ADC, a sequence of digital values corresponding to samples of the received primary analog signal and secondary analog signal;

weighting the sequence of digital values to output a single digital value representing the sensor measurement, wherein the second period is at least partly overlapping with a third period during which a voltage representing the sensor measurement settles.

10. The method of claim 9, further comprising switching input to the incremental sigma-delta ADC from the primary analog signal to the secondary analog signal in synchronization with a start of the third period.

11. The method of claim 9, wherein the primary analog signal is received on a first input line to the incremental sigma-delta ADC and wherein the secondary signal is received on a second input line to the incremental sigma-delta ADC.

12. The method of claim 11, further comprising switching input to the incremental sigma-delta ADC by controlling which of the first input line and the second input line is connected to the incremental sigma-delta ADC, said switching controlling a transition from the first period to the second period.

* * * * *